United States Patent
Lin et al.

(10) Patent No.: US 6,294,476 B1
(45) Date of Patent: Sep. 25, 2001

(54) PLASMA SURFACE TREATMENT METHOD FOR FORMING PATTERNED TEOS BASED SILICON OXIDE LAYER WITH RELIABLE VIA AND INTERCONNECTION FORMED THERETHROUGH

(75) Inventors: Sen-Horng Lin, Hsinchu; How-Ming Lien, Taipei; Yin Chen, Hsinchu, all of (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/676,763

(22) Filed: Oct. 2, 2000

Related U.S. Application Data

(62) Division of application No. 09/050,209, filed on Mar. 30, 1998, now Pat. No. 6,143,666.

(51) Int. Cl.$^7$ .................................................. H01L 21/18
(52) U.S. Cl. .................. 438/725; 438/700; 438/706; 438/710; 438/712; 438/723
(58) Field of Search ............................. 438/700, 706, 438/710, 712, 723, 725

(56) References Cited

U.S. PATENT DOCUMENTS

| | | | |
|---|---|---|---|
| 5,180,689 | * 1/1993 | Lin et al. | 437/228 |
| 5,453,403 | 9/1995 | Meng et al. | 437/195 |
| 5,552,343 | 9/1996 | Hsu | 437/195 |
| 5,622,883 | 4/1997 | Kim | 438/396 |

* cited by examiner

Primary Examiner—Charles Bowers
Assistant Examiner—Lisa Kilday
(74) Attorney, Agent, or Firm—George O. Saile; Stephen B. Ackerman; Stephen G. Stanton

(57) ABSTRACT

A method for forming a via through a dielectric layer within a microelectronics fabrication. There is first provided a substrate employed within a microelectronics fabrication. There is then formed over the substrate a silicon oxide dielectric layer, where the silicon oxide dielectric layer is formed through use of a plasma enhanced chemical vapor deposition (PECVD) method employing tetra-ethyl-orthosilicate (TEOS) as a silicon source material. There is then treated the silicon oxide dielectric layer with a plasma to form a plasma treated silicon oxide dielectric layer. Finally, there is then formed upon the plasma treated silicon oxide dielectric layer a patterned photoresist layer employed in defining the location of a via to be formed through the plasma treated silicon oxide dielectric layer. Through use of the method, the patterned photoresist layer is less susceptible to delamination from the plasma treated silicon oxide dielectric layer within an isotropic etch method employed in etching the plasma treated silicon oxide dielectric layer than is an otherwise equivalent patterned photoresist layer from an otherwise equivalent silicon oxide dielectric layer absent the plasma treatment.

14 Claims, 5 Drawing Sheets

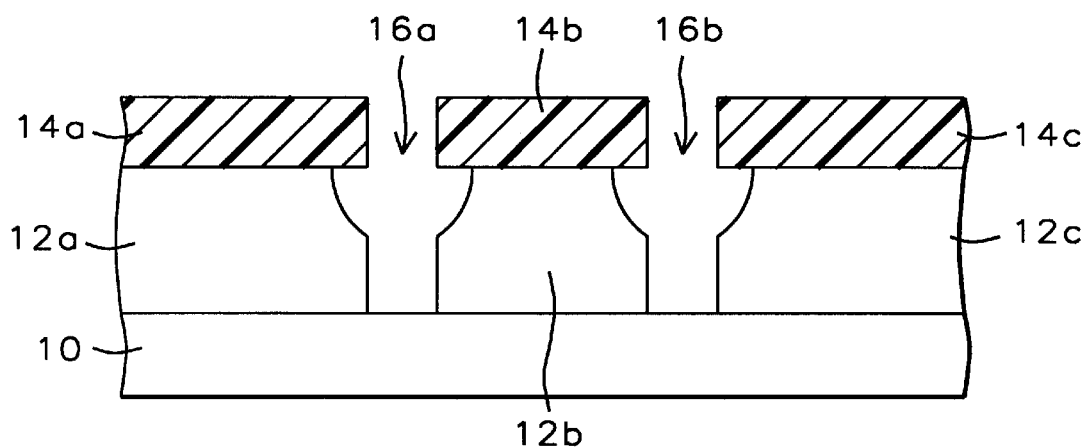
FIG. 1 – Prior Art
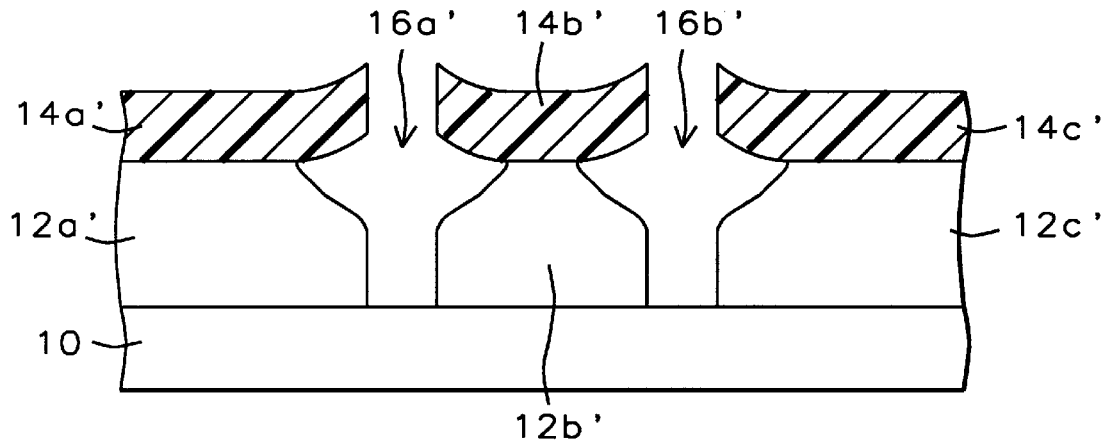
FIG. 2 – Prior Art
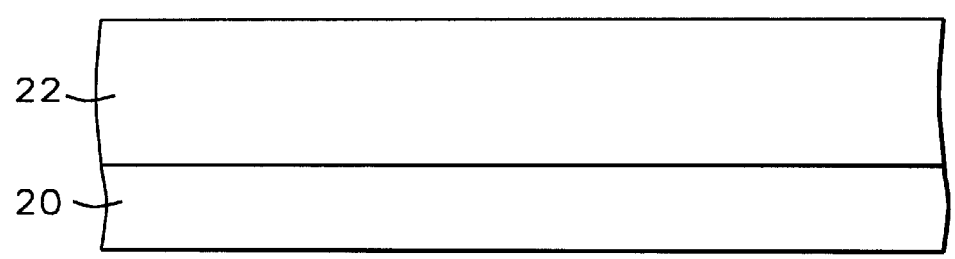
FIG. 3 – Prior Art

US 6,294,476 B1

PLASMA SURFACE TREATMENT METHOD FOR FORMING PATTERNED TEOS BASED SILICON OXIDE LAYER WITH RELIABLE VIA AND INTERCONNECTION FORMED THERETHROUGH

This is a division of patent application Ser. No. 09/050,209, filing date Mar. 30, 1998 now U.S. Pat. No. 6,143,666, entitled Plasma Surface Treatment Method For Forming Patterned TEOS Base Silicon Oxide Layer With Reliabe Via and Interconnection Formed Therethrough.

BACKGROUND OF THE INVENTION

1. Field of the Invention

The present invention relates generally to methods for forming vias through dielectric layers within microelectronics fabrications. More particularly, the present invention relates to methods for forming vias of reproducible cross-sectional profile through dielectric layers within microelectronics fabrications.

2. Description of the Related Art

Common in the art of microelectronics fabrication is the use of silicon oxide layers formed through use of chemical vapor deposition (CVD) methods, such as thermal chemical vapor deposition (CVD) methods and plasma enhanced chemical vapor deposition (PECVD) methods employing tetra-ethyl-ortho-silicate (TEOS) as a silicon source material, for forming dielectric layers within microelectronics fabrications. Such dielectric layers may include, but not limited to, pre-metal dielectric (PMD) layers, inter-metal dielectric (IMD) layers and post metal dielectric (ie: passivation dielectric) layers. Silicon oxide dielectric layers formed within microelectronics fabrications through use of thermal chemical vapor deposition (CVD) methods and plasma enhanced chemical vapor deposition (PECVD) methods employing tetra-ethyl-ortho-silicate (TEOS) as a silicon source material are desirable within microelectronics fabrications since such silicon oxide dielectric layers are often formed with enhanced properties in comparison with silicon oxide dielectric layers formed through use of other methods and materials.

When employing, in particular, within advanced microelectronics fabrications silicon oxide dielectric layers formed at least in part through use of plasma enhanced chemical vapor deposition (PECVD) methods employing tetra-ethyl-ortho-silicate (TEOS) as a silicon source material as dielectric layers through which are desired to form comparatively high areal density narrow linewidth vias to underlying structures, such as but not limited to underlying patterned conductor layer structures, it is common in the art of advanced microelectronics fabrication to form through such silicon oxide dielectric layers at least one wine glass shaped via, as illustrated in FIG. 1.

Shown in FIG. 1 is a substrate layer 10 having formed thereupon a series of patterned silicon oxide dielectric layers 12a, 12b and 12c at least the top surfaces of which are formed through use of a plasma enhanced chemical vapor deposition (PECVD) method employing tetra-ethyl-ortho-silicate (TEOS) as a silicon source material, where the series of patterned silicon oxide dielectric layers 12a, 12b and 12c defines a pair of wine glass shaped vias 16a and 16b. Formed upon the series of patterned silicon oxide dielectric layers 12a, 12b and 12c is a corresponding series of patterned photoresist layers 14a, 14b and 14c which assist in defining the location of the pair of wine glass shaped vias 16a and 16b. As is understood by a person skilled in the art, the wine glass shape of each of the wine glass shaped vias 16a and 16b is desirable to assure optimal step coverage when subsequently filling within the pair of wine glass shaped vias 16a and 16b a blanket conductor layer when further fabricating the microelectronics fabrication whose schematic cross-sectional diagram is illustrated in FIG. 1.

In order to form the wine glass shaped profile within each of the wine glass shaped vias 16a or 16b within the pair of wine glass shaped vias 16a and 16b, there is typically employed when forming the microelectronics fabrication whose schematic cross-sectional diagram is illustrated in FIG. 1 from a corresponding microelectronics fabrication employing a blanket silicon oxide dielectric layer formed beneath the patterned photoresist layers 14a, 14b and 14c either: (1) a sequential partial anisotropic etch/partial isotropic etch/complete anisotropic etch method for forming the patterned silicon oxide dielectric layers 12a, 12b and 12c from the blanket silicon oxide dielectric layer; or (2) a sequential partial isotropic etch/complete anisotropic etch method for forming the patterned silicon oxide dielectric layers 12a, 12b and 12c from the blanket silicon oxide dielectric layer. The anisotropic etch methods employed within the foregoing sequential etch methods are typically, but not exclusively, reactive ion etch (RIE) anisotropic etch methods, while the isotropic etch methods employed within the foregoing sequential etch methods are typically, although not exclusively, wet chemical etch methods.

While a microelectronics fabrication having formed therein a series of patterned silicon oxide dielectric layers, such as the series of patterned silicon oxide dielectric layers 12a, 12b and 12c as illustrated in FIG. 1, which define a pair of wine glass shaped vias, such as the pair of wine glass shaped vias 16a and 16b as illustrated within FIG. 1, is desirable within the art of microelectronics fabrication, such microelectronics fabrications are not formed entirely without problems within microelectronics fabrication. In particular, it is common in the art of microelectronics fabrication for a series of patterned photoresist layers, such as the series of patterned photoresist layers 14a, 14b and 14c as illustrated in FIG. 1, to at least partially delaminate from the surfaces of a series of patterned silicon oxide dielectric layers, such as the series of patterned silicon oxide dielectric layers 12a, 12b and 12c as illustrated in FIG. 1, thus forming a microelectronics fabrication whose schematic cross-sectional diagram is similar to the schematic cross-sectional diagram as illustrated in FIG. 2.

Shown in FIG. 2 is a schematic cross-sectional diagram of a microelectronics fabrication largely equivalent to the microelectronics fabrication whose schematic cross-sectional diagram is illustrated in FIG. 1, but wherein: (1) each patterned photoresist layer 14a, 14b or 14c within the series of patterned photoresist layers 14a, 14b and 14c as illustrated in FIG. 1 is partially delaminated in forming the series of partially delaminated patterned photoresist layers 14a', 14b' and 14c'; (2) the corresponding series of patterned silicon oxide dielectric layers 12a, 12b and 12c is thus over-etched in forming the series of over-etched patterned silicon oxide dielectric layers 12a', 12b' and 12c'; and (3) the pair of wine glass shaped vias 16a and 16b is over-etched in forming the pair of over-etched wine glass shaped vias 16a' and 16b'.

Microelectronics fabrications whose schematic cross-sectional diagrams correspond with the microelectronics fabrication as illustrated in FIG. 2 are undesirable within advanced microelectronics fabrication since it is often difficult to form ally functional or reliable conductor contact or interconnection layers within over-etched wine glass shaped vias, such as the over-etched wine glass shaped vias 16a' and 16b' as illustrated in FIG. 2. It is thus desirable in the art of microelectronics fabrication to provide methods and materials through which wine glass shaped vias may be formed through silicon oxide dielectric layers formed through use of chemical vapor deposition (CVD) methods employing tetra-ethyl-ortho-silicate (TEOS) as a silicon source material, such as plasma enhanced chemical vapor deposition (PECVD) methods employing tetra-ethyl-ortho-silicate (TEOS) as a silicon source material, without over-etching those wine-glass shaped vias due to partial delamination of patterned photoresist layers which are employed in defining the location of those wine glass shaped vias, that the present invention is generally directed.

Various methods have been disclosed in the art of microelectronics fabrication, and in particular within the art of integrated circuit microelectronics fabrication, for forming wine glass shaped vias and wine glass shaped structures within microelectronics fabrications.

For example, Liu et al., in U.S. Pat. No. 5,180,689, discloses a method for forming within an integrated circuit microelectronics fabrication a wine glass shaped via through a multilayer dielectric layer within the integrated circuit microelectronics fabrication. The method employs a sequential partial anisotropic etch/partial isotropic etch/complete anisotropic etch method, along with a single patterned photoresist layer formed upon the multilayer dielectric layer, when forming the wine glass shaped via through the multilayer dielectric layer. The wine glass shaped via so formed is formed while avoiding a high temperature reflow of the resulting patterned multilayer dielectric layer.

In addition, Meng et al, in U.S. Pat. No. 5,453,403, discloses a similar method for forming within an integrated circuit microelectronics fabrication a wine glass shaped via through a dielectric layer within the integrated circuit microelectronics fabrication. The method employs a sequential partial anisotropic etch/partial isotropic etch method for forming a bowl shaped via partially through the dielectric layer while employing a single patterned photoresist layer as an etch mask layer in defining the location of the bowl shaped via. The patterned photoresist layer is then removed and the bowl shaped via is etched through use of an argon sputtering plasma anisotropic etch method to form a wine glass shaped via completely through the dielectric layer while simultaneously planarizing and smoothing sharp edges of the dielectric layer.

Further, Hsu, in U.S. Pat. No. 5,552,343, discloses a method for forming within an integrated circuit microelectronics fabrication a wine glass shaped via through a boron and phosphorus doped silicon oxide dielectric layer formed employing a tetra-ethyl-ortho-silicate (TEOS) silicon source material within the integrated circuit microelectronics fabrication. The method employs a buffered oxide etchant (BOE) to remove a densified layer of the boron and phosphorus doped silicon oxide dielectric layer prior to forming thereupon a patterned photoresist layer which is employed in defining the location of the wine glass shaped via. Through the method, there is formed the wine glass shaped via with a small entry angle at the surface of the boron and phosphorus doped silicon oxide dielectric layer.

Finally, Kim, in U.S. Pat. No. 5,622,883 discloses a method for forming within an integrated circuit microelectronics fabrication both a wine glass shaped via through a dielectric layer and a wine glass shaped landing pad contacting a wine glass shaped conductive contact stud layer formed within the wine glass shaped via. The method employs a sequential partial isotropic etch/complete anisotropic etch method for forming the wine glass shaped via through the dielectric layer.

Desirable within the art of microelectronics fabrication are additional methods and materials through which a wine glass shaped via may be formed through a silicon oxide dielectric layer formed through use of a chemical vapor deposition (CVD) method, such as a plasma enhanced chemical vapor deposition (PECVD) method, employing tetra-ethyl-ortho-silicate (TEOS) as a silicon source material, within a microelectronics fabrication without over-etching the wine-glass shaped vias due to partial delamination from the silicon oxide dielectric layer of a patterned photoresist layer employed in defining the location of the wine glass shaped via. More particularly desirable within the art of integrated circuit microelectronics fabrication are methods and materials through which a wine glass shaped via may be formed through a silicon oxide dielectric layer formed through use of a chemical vapor deposition (CVD) method, such as a plasma enhanced chemical vapor deposition (PECVD) method, employing tetra-ethyl-ortho-silicate (TEOS) as a silicon source material, within an integrated circuit microelectronics fabrication without over-etching the wine-glass shaped via due to partial delamination from the silicon oxide dielectric layer of a patterned photoresist layer employed in defining the location of the wine glass shaped via. It is towards the foregoing goals that the present invention is more specifically directed.

SUMMARY OF THE INVENTION

A first object of the present invention is to provide a method for forming within a microelectronics fabrication a wine-glass shaped via through a silicon oxide dielectric layer formed through use of a chemical vapor deposition (CVD) method, such as a plasma enhanced chemical vapor deposition (PECVD) method, employing tetra-ethyl-ortho-silicate (TEOS) as a silicon source material.

A second object of the present invention is to provide a method in accord with the first object of the present invention, where the wine-glass shaped via is formed without over-etching the wine-glass shaped via due to partial delamination from the silicon oxide dielectric layer of a patterned photoresist layer employed in defining the location of the wine glass shaped via.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming within a microelectronics fabrication a via through a silicon oxide dielectric layer formed through use of a chemical vapor deposition (CVD) method employing tetra-ethyl-ortho-silicate (TEOS) as a silicon source material. To practice the method of the present invention, there is first provided a substrate employed within a microelectronics fabrication. There is then formed over the substrate a silicon oxide dielectric layer, where the silicon oxide dielectric layer is formed through use of a chemical vapor deposition (CVD) method employing tetra-ethyl-ortho-silicate (TEOS)

as a silicon source material. The silicon oxide dielectric layer is then treated with a plasma to form a plasma treated silicon oxide dielectric layer. There is then formed upon the plasma treated silicon oxide dielectric layer a patterned photoresist layer employed in defining the location of a via to be formed through the plasma treated silicon oxide dielectric layer. The patterned photoresist layer is less susceptible to delamination from the plasma treated silicon oxide dielectric layer within an isotropic etch method employed in etching the plasma treated silicon oxide dielectric layer than is an otherwise equivalent patterned photoresist layer from an otherwise equivalent silicon oxide dielectric layer absent the plasma treatment. Finally, there is then etched through the silicon oxide dielectric layer the via while employing isotropic etch method.

The present invention provides a method for forming within a microelectronics fabrication a wine glass shaped via through a silicon oxide dielectric layer formed through use of a chemical vapor deposition (PECVD) method employing tetra-ethyl-ortho-silicate (TEOS) as a silicon source material, where the wine glass shaped via is formed without over-etching the wine glass shaped via due to partial delamination from the silicon oxide dielectric layer of a patterned photoresist layer employed in defining the location of the wine glass shaped via. The method of the present invention realizes this object by first treating the silicon oxide dielectric layer with a plasma to form a plasma treated silicon oxide dielectric layer prior to forming thereupon the patterned photoresist layer employed in defining the location of the wine glass shaped via. While the mechanism through which the plasma treatment of the silicon oxide dielectric layer assists in improving adhesion of a patterned photoresist layer to the silicon oxide dielectric layer is not entirely clear, it is nonetheless clear that the silicon oxide dielectric layer when treated with a plasma may have formed therethrough a wine glass shaped via without over-etching the wine glass shaped via due to partial delamination from the silicon oxide dielectric layer of the patterned photoresist layer employed in defining the location of the wine glass shaped via.

The method of the present invention may be employed where the microelectronics fabrication is an integrated circuit microelectronics fabrication. The present invention does not discriminate with respect to the nature of a microelectronics fabrication within which is formed a wine glass shaped via through a silicon oxide dielectric layer formed through use of a chemical vapor deposition (PECVD) method employing tetra-ethyl-ortho-silicate (TEOS) as the silicon source material in accord with the method of the present invention. Thus, the present invention may be employed when fabricating microelectronics fabrications including but not limited to integrated circuit microelectronics fabrications, solar cell microelectronics fabrications, ceramic substrate microelectronics fabrications and flat panel display microelectronics fabrications. Similarly, the silicon oxide dielectric layer through which is formed the wine glass shaped via through the method of the present invention may be formed within locations within microelectronics fabrications including but not limited to pre-metal dielectric (PMD) layer locations, inter-metal dielectric (IMD) layer locations and passivation (post-metal) dielectric layer locations.

The method of the present invention is readily manufacturable. The method of the present invention employs a plasma treatment of a silicon oxide dielectric layer formed through use of a chemical vapor deposition (CVD) method employing tetra-ethyl-ortho-silicate (TEOS) as a silicon source material for enhancing adhesion of a patterned photoresist layer to the silicon oxide dielectric layer and thus providing a wine glass shaped via through the silicon oxide dielectric layer without over-etching the wine glass shaped via. Since plasma methods are generally known in the art of microelectronics fabrication, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 shows a schematic cross-sectional diagrams illustrating a pair of wine glass shaped vias formed through a silicon oxide dielectric layer within a microelectronics fabrication through use of a method conventional in the art of microelectronics fabrication.

FIG. 2 shows a schematic cross-sectional diagram illustrating a pair of over-etched wine glass shaped vias formed through a silicon oxide dielectric layer due to partial delamination from the silicon oxide dielectric layer of a series of patterned photoresist layers employed in defining the locations of the wine glass shaped vias through a method conventional in the art of microelectronics fabrication.

FIG. 3 to FIG. 6 show a series of schematic cross-sectional diagrams illustrating the results of progressive stages in forming within a silicon oxide dielectric layer within a microelectronics fabrication in accord with a general preferred embodiment of the present invention which comprises a first preferred embodiment of the present invention a pair of wine glass shaped vias without over-etching the pair of wine glass shaped vias.

DESCRIPTION OF THE PREFERRED EMBODIMENTS

Figure 4:
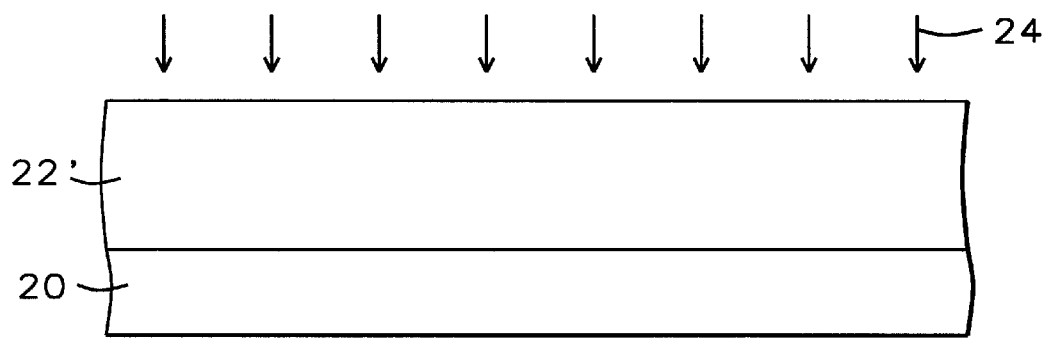

The present invention provides a method for forming within a microelectronics fabrication through a silicon oxide dielectric layer formed through use of a chemical vapor deposition (CVD) method employing tetra-ethyl-orthosilicate (TEOS) as a silicon source material a wine glass shaped via without over-etching the wine glass shaped via due to partial delamination from the silicon oxide dielectric layer of a patterned photoresist layer employed in defining the location of the wine glass shaped via. The method of the present invention realizes this object by plasma treating the silicon oxide dielectric layer prior to forming thereupon the patterned photoresist layer employed in defining the location of the wine glass shaped via.

Although the present invention provides substantial value in forming within integrated circuit microelectronics fabrications wine glass shaped vias through silicon oxide intermetal dielectric (IMD) layers at least the exposed surfaces of which are formed through use of plasma enhanced chemical vapor deposition methods employing tetra-ethyl-orthosilicate (TEOS) as a silicon source material, the method of the present invention may be employed in forming wine glass shaped vias without over-etching those wine glass shaped vias within microelectronics fabrications including but not limited to integrated circuit microelectronics fabrications, solar cell microelectronics fabrications, ceramic substrate microelectronics fabrications and flat panel display microelectronics fabrications, where the silicon oxide dielectric layers are formed within locations including but not limited to pre-metal dielectric (PMD) layer locations, inter-metal dielectric (IMD) layer locations and passivation (ie: post metal) dielectric layer locations.

First Preferred Embodiment

Referring now to FIG. 3 to FIG. 6, there is shown a series of schematic cross-sectional diagram illustrating the results of progressive stages of forming within a microelectronics fabrication in accord with a general preferred embodiment of the present invention which comprises a first preferred embodiment of the present invention a pair of wine glass shaped vias through a silicon oxide dielectric layer without over-etching the pair of wine glass shaped vias. Shown in FIG. 1 is a schematic cross-sectional diagram of the microelectronics fabrication at an early stage in its fabrication.

Shown in FIG. 3 is a substrate 20 having formed thereupon a blanket silicon oxide dielectric layer 22. Within the first preferred embodiment of the present invention, the substrate 20 is a substrate employed within a microelectronics fabrication including but not limited to an integrated circuit microelectronics fabrication, a solar cell microelectronics fabrication, a ceramic substrate microelectronics fabrication and a flat panel display microelectronics fabrication. Similarly, within the first preferred embodiment of the present invention, the substrate 20 may be a discrete substrate employed within the microelectronics fabrication, or the substrate may alternatively also have formed thereupon or thereover any of several microelectronics layers typically employed within the microelectronics fabrication. Such microelectronics layers may include, but are not limited to microelectronics conductor layers, microelectronics semiconductor layers and microelectronics dielectric layers.

With respect to the blanket silicon oxide dielectric layer 22, at least the exposed portion of the blanket silicon oxide dielectric layer 22 is formed through use of a chemical vapor deposition (CVD) method employing tetra-ethyl-orthosilicate (TEOS) as a silicon source material. The chemical vapor deposition (CVD) method may be a thermal chemical vapor deposition (CVD) method or a plasma enhanced chemical vapor deposition (PECVD) method. Similarly, the silicon oxide dielectric layer may be an undoped silicon oxide dielectric layer or a doped silicon oxide dielectric layer doped with dopants such as but not limited to boron dopants and phosphorus dopants in minor amounts of up to about 12 atom percent, as is known in the art of microelectronics fabrication. Preferably, the chemical vapor deposition (CVD) method also employs: (1) a reactor chamber pressure appropriate to the chemical vapor deposition (CVD) method (i.e. from about 6 to about 10 torr for a plasma enhanced chemical vapor deposition (PECVD) method, from about 30 to about 50 torr for a low pressure chemical vapor deposition (LPCVD) method, from about 350 to about 450 torr for a sub-atmospheric pressure chemical vapor deposition (SACVD) method and about 760 torr for an atmospheric pressure chemical vapor deposition (APCVD) method), (2) a radio frequency power (for plasma activation only) of from about 600 to about 900 watts at a radio frequency of 13.56 MHZ; (3) a substrate 20 temperature of from about 350 to about 550 degrees centigrade for a thermal chemical vapor deposition (CVD) method or about 350 to about 450 degrees centigrade for a plasma enhanced chemical vapor deposition (PECVD) method; (4) a susceptor spacing of from about 180 to about 280 mils; (5) a tetra-ethyl-ortho-silicate (TEOS) concentration and flow rate appropriate to the chemical vapor deposition (CVD) method (i.e. from about 700 to about 1200 milligrams per cubic meter (mgm) for a plasma enhanced chemical vapor deposition (PECVD) method, from about 350 to about 600 milligrams per cubic meter (mgm) for a low pressure chemical vapor deposition (LPCVD) method and from about 200 to about 400 milligrams per cubic meter (mgm) for either a sub-atmospheric pressure chemical vapor deposition (SACVD) method or an atmospheric pressure chemical vapor deposition (APCVD) method); (6) an oxygen or ozone oxidant flow rate of from about 400 to about 8000 standard cubic centimeters per minute (sccm), as appropriate to the chemical vapor deposition (CVD) method; and (6) a background helium flow rate appropriate to the chemical vapor deposition (CVD) method (i.e. up to about 1000 standard cubic centimeters per minute (sccm) for a plasma enhanced chemical vapor deposition (PECVD) method, from about 1000 to about 1400 standard cubic centimeters per minute (sccm) for a low pressure chemical vapor deposition (LPCVD) method and from about 3500 to about 4500 standard cubic centimeters per minute (sccm) for a sub-atmospheric pressure chemical vapor deposition (SACVD) method. Preferably, the blanket silicon oxide dielectric layer 22 is formed to a thick ness of from about 4000 to about 5000 angstroms.

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated in FIG. 3, but wherein the exposed portion of the blanket silicon oxide dielectric layer 22 is treated with a plasma 24 to form a blanket plasma treated silicon oxide dielectric layer 22'. Within the first preferred embodiment of the present invention, the plasma 24 is preferably a plasma comprising oxygen or nitrogen. More preferably, the plasma 24 is preferably a plasma consisting of oxygen or nitrogen. Most preferably, the plasma 24 is a plasma consisting of oxygen. While the mechanism through which the first plasma 24 modifies the blanket silicon oxide dielectric layer 22 in forming the blanket plasma treated silicon oxide dielectric layer 22' is not entirely clear, it is nonetheless clear that by treating with the first plasma 24 the blanket silicon oxide dielectric layer 22 to form the blanket plasma treated silicon oxide dielectric layer 22' there is formed the blanket plasma treated silicon oxide dielectric layer 22' through which there may subsequently be formed a wine glass shaped via without over-etching the wine glass shaped via due to partial delamination from the blanket plasma treated silicon oxide dielectric layer 22' of a patterned photoresist layer employed in defining the location of the wine glass shaped via. Although speculative, the first plasma 24 may remove impurities from the surface of the blanket silicon oxide dielectric layer 22 or the first plasma 24 may otherwise modify the surface of the blanket silicon oxide dielectric layer 22 to form the blanket plasma treated silicon oxide dielectric layer 22' whose surface is more receptive to the patterned photoresist layer.

Although not specifically illustrated by the schematic cross-sectional diagrams of FIG. 3 and FIG. 4, the first plasma 24 treatment of the blanket silicon oxide dielectric layer 22 is preferably undertaken in-situ within the same reactor chamber or within an adjoining reactor chamber (absent atmospheric exposure) within a multi-chamber reactor tool within which is formed the blanket silicon oxide dielectric layer 22 upon the substrate 20. Under such circumstances there is provided enhanced manufacturing efficiency and reliability in forming both the blanket silicon oxide dielectric layer 22 upon the substrate 20 and the blanket plasma treated silicon oxide dielectric layer 22' upon the substrate 20.

Preferably, the first plasma 24 also employs: (1) a reactor chamber pressure of from about 7 to about 11 torr; (2) a radio frequency power of from about 600 to about 800 watts at a radio frequency of 13.56 MHZ; (3) at a substrate 20 temperature of from about 350 to about 450 degrees centigrade; (4) a susceptor spacing of from about 180 to about 280 mils; (5) an oxygen flow or from about 400 to about 600 standard cubic centimeters per minute (sccm) or a nitrogen flow rate of from about 2000 to about 3000 standard cubic centimeters per minute (sccm); and (6) at a first plasma 24 exposure tine of from about 3 to about 10 seconds.

Figure 5:
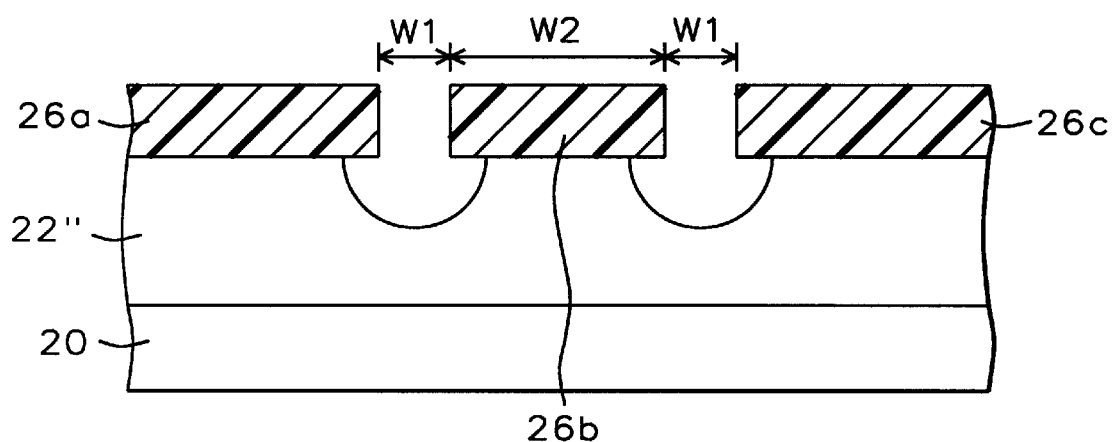

Referring now to FIG. 5, there is shown at a schematic cross-sectional diagram illustrating the results of further processing of the microelectronics fabrication whose schematic cross-sectional diagram is illustrated in FIG. 4. Shown in FIG. 5 is a schematic cross-sectional diagram of at a microelectronics fabrication otherwise equivalent to the microelectronics fabrication whose schematic cross-sectional diagram is illustrated in FIG. 4, but wherein there has been formed upon the blanket plasma treated silicon oxide dielectric layer 22' a series of patterned photoresist layers 26a, 26b and 26c. Methods and materials through which may be formed patterned photoresist layers are known in the art of microelectronics fabrication. Patterned photoresist layers are typically formed within microelectronics fabrications through patterning, through methods as are conventional in the art, of blanket photoresist layers formed within microelectronics fabrications. The blanket photoresist layers may be formed of photoresist materials chosen from the general groups of photoresist materials including but not limited to positive photoresist materials and negative photoresist materials.

For the first preferred embodiment of the present invention, the series of patterned photoresist layers 26a, 26b and 26c is preferably formed of a positive photoresist material since positive photoresist materials generally provide within microelectronics fabrications patterned photoresist layers of enhanced dimensional stability. Other materials may however also be employed in forming the series of patterned photoresist layers 26a, 26b and 26c. Preferably the patterned photoresist layers 26a, 26b and 26c are each formed to a thickness upon the blanket plasma treated silicon oxide dielectric layer 22' of from about 8000 to about 10000 angstroms to define at a pair of apertures each of aperture width W1 of from about 0.45 to about 0.65 microns as illustrated in FIG. 5 separated by a pitch width W2 of from about 0.3 to about 2.0 microns as is similarly illustrated in FIG. 5.

Shown also in FIG. 5 is the results of partially isotropically etching the blanket plasma treated silicon oxide dielectric layer 22' to form the partially isotropically etched blanket plasma treated silicon oxide dielectric layer 22". When partially isotropically etching the blanket plasma treated silicon oxide dielectric layer 22' to form the partially isotropically etched blanket plasma treated silicon oxide dielectric layer 22" there is employed an isotropic etchant as is conventional in the art of microelectronics fabrication. Although the isotropic etchant may be selected from the group of isotropic etchants including but not limited to wet chemical isotropic etchants incorporating hydrofluoric acid and dry plasma isotropic etchants employing fluorine containing etchant species at a comparatively high reactor chamber pressure of greater than about 350 mtorr, for the first preferred embodiment of the present invention, the isotropic etchant is preferably at a buffered oxide etchant (BOE) comprising aqueous ammonium fluoride and aqueous hydrofluoric acid as is conventional in the art of microelectronics fabrication. Preferably, the partially isotropically etched blanket plasma treated silicon oxide dielectric layer 22" has formed therein a pair of bowl shaped apertures as illustrated in FIG. 5. Preferably the horizontal (ie: lateral):vertical etch rate ratio of the partially isotropically etched blanket plasma treated silicon oxide dielectric layer 22" within the isotropic etchant is no greater than about 1.8:1 and is more preferably from about 1:1 to about 1.4:1.

Figure 6:
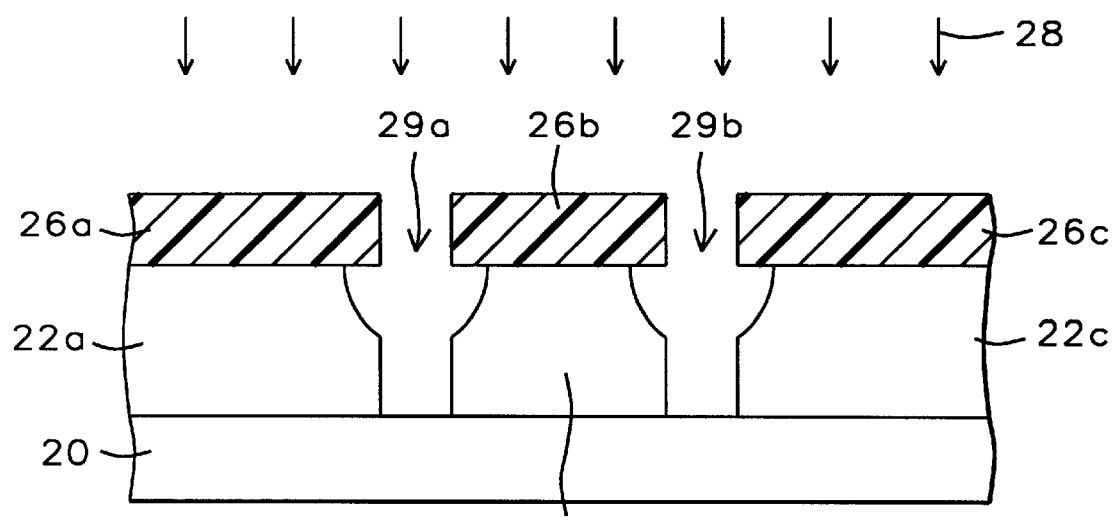

Referring now to FIG. 6, there is shown at a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein the pair of bowl shaped apertures within the partially isotropically etched blanket plasma treated silicon oxide dielectric layer 22" is completely etched to form a pair of wine glass shaped vias 29a and 29b each reaching the substrate 20, while simultaneously forming the series of patterned plasma treated silicon oxide dielectric layers 22a, 22b and 22c. The pair of wine glass shaped vias 29a and 29b is formed through a second plasma 28 treatment of the partially isotropically etched blanket plasma treated silicon oxide dielectric layer 22" while employing the patterned photoresist layers 26a, 26b and 26c as an etch mask layer. Within the first preferred embodiment of the present invention, the second plasma is 28 is typically and preferably an anisotropic reactive ion etch (RIE) plasma typically employing a fluorine containing etchant gas species.

As is illustrated within the schematic cross-sectional diagram of FIG. 6, the pair of wine glass shaped vias 29a and 29b is formed without over-etching due to partial delamination of the series of patterned photoresist layers 26a, 26b and 26c from the series of patterned plasma treated silicon oxide dielectric layers 22a, 22b and 22c. Since the pair of wine glass shaped vias 29a and 29b is formed without over-etching due to partial delamination of the series of patterned photoresist layers 26a, 26b and 26c from the series of patterned plasma treated silicon oxide dielectric layers 22a, 22b and 22c, a pair of wine glass shaped conductor contact layers or conductor interconnection layers formed within pair of wine glass shaped vias 29a and 29b may be formed with greater dimensional stability, enhanced functionality and improved reliability.

Second Preferred Embodiment

Figure 7:
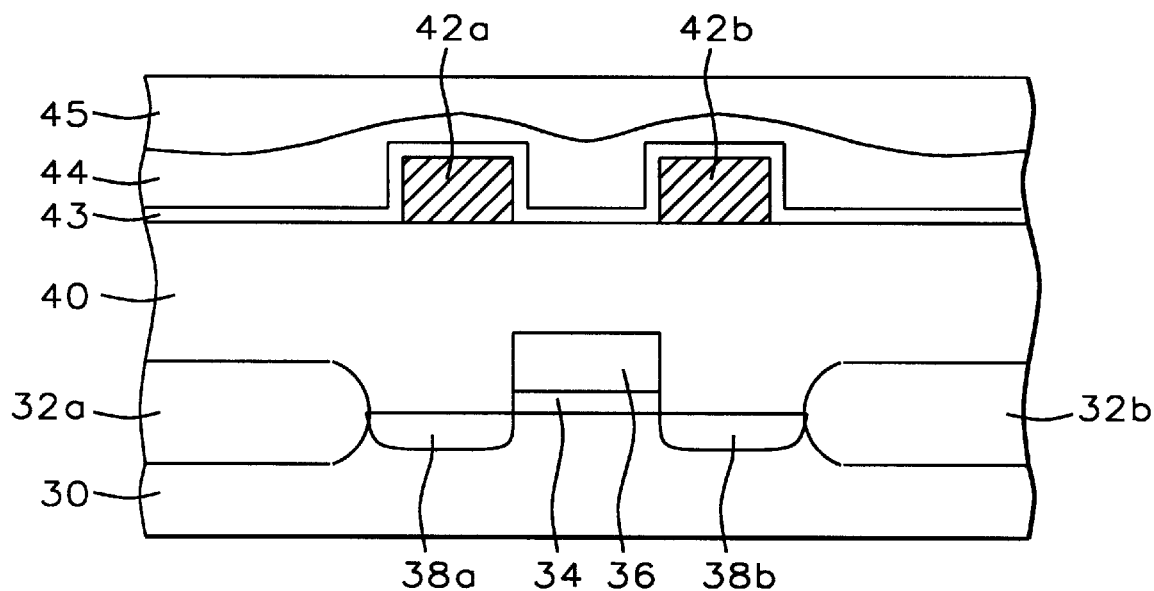
FIG. 7 to FIG. 11 show a series of schematic cross-sectional diagrams illustrating the results of progressive stages in forming within an inter-metal dielectric (IMD) layer within an integrated circuit microelectronics fabrication in accord with a more specific preferred embodiment of the present invention which comprises a second preferred embodiment of the present invention a pair of wine glass shaped vias without over-etching the pair of wine glass shaped vias.

Referring now to FIG. 7 to FIG. 11, there is shown a series of schematic cross-sectional diagrams illustrating the results of forming within an integrated circuit microelectronics fabrication in accord with at a more specific preferred embodiment of the present invention which comprises at a second preferred embodiment of the present invention a pair of wine glass shaped interconnection vias through an inter-metal dielectric (IMD) layer without over-etching the pair of wine glass shaped vias. Shown in FIG. 7 is a schematic cross-sectional diagram of the integrated circuit microelectronics fabrication at an early stage in its fabrication.

Shown in FIG. 7 is a semiconductor substrate 30 having formed within and upon its surface a pair of isolation regions which define an active region of the semiconductor substrate 30. Although semiconductor substrates are known in the art of integrated circuit microelectronics fabrication with either dopant polarity, various dopant concentrations and several crystallographic orientations, for the second preferred embodiment of the present invention the semiconductor substrate 30 is preferably at a (100) silicon semiconductor substrate having an N- or P-doping. Similarly, although it is also known in the art of integrated circuit microelectronics fabrication that isolation regions may be formed within and/or upon semiconductor substrates to define active regions of those semiconductor substrates through methods including but not limited to isolation regions thermal growth methods and isolation region deposition/patterning methods, for the second preferred embodiment of the present invention the isolation regions 32a and 32b are preferably formed within and upon the semiconductor substrate 30 to define an active region of the semiconductor substrate 30 through an isolation region thermal growth method which forms the isolation regions 32a and 32b of silicon oxide within and upon the semiconductor substrate 30.

Also shown within FIG. 7 formed within and upon the active region of the semiconductor substrate 30 is at a series of structures which forms a field effect transistor (FET). The series of structures includes: (1) a gate dielectric layer 34 formed upon the active region of the semiconductor substrate 30; (2) a gate electrode 36 formed and aligned upon the gate dielectric layer 34; and (3) a pair of source/drain regions 38a and 38b formed into the active region of the semiconductor substrate 30 at areas not covered by the gate dielectric layer 34 and the gate electrode 36. Each of the foregoing structures which forms the field effect transistor (FET) may be formed through use of methods and materials as are conventional in the art of field effect transistor (FET) fabrication within integrated circuit microelectronics fabrication. Typically and preferably, although not exclusively, the gate dielectric layer 34 is formed through a thermal oxidation method to form the gate dielectric layer 34 of silicon oxide of thickness about 80 to about 140 angstroms upon the active region of the semiconductor substrate 30. Typically and preferably, although not exclusively, the gate electrode 36 is formed and aligned upon the gate dielectric layer 34 to form the gate electrode 36 of thickness about 1500 to about 2500 angstroms of a doped polysilicon or at a polycide (doped polysilicon/metal silicide) gate electrode material. Finally, the source/drain regions 38a and 38b are typically and preferably formed within the active region of the semiconductor substrate 30 at an ion implantation dose of from about 1E13 to about 1E16 ions per square centimeter and an ion implantation energy of from about 35 to about 50 keV while employing the gate dielectric layer 34 and the gate electrode 36 as a mask.

Shown also within FIG. 7 formed over the semiconductor substrate 30 including the structures which form the field effect transistor (FET) is a planarized pre-metal dielectric (PMD) layer 40. Methods and materials through which planarized pre-metal dielectric (PMD) layers may be formed within integrated circuit microelectronics fabrication are known in the art of integrated circuit microelectronics fabrication. Planarized pre-metal dielectric (PMD) layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 40 is preferably formed of a silicon oxide dielectric material formed through use of a plasma enhanced chemical vapor deposition (PECVD) method analogous or equivalent to the plasma enhanced chemical vapor deposition (PECVD) method through which is formed at least the upper portion of the silicon oxide dielectric layer 22 as illustrated in FIG. 3. Preferably, the planarized pre-metal dielectric (PMD) layer 40 so formed is formed to a thickness of from about 9000 to about 12000 angstroms.

Shown also within FIG. 7 formed upon the planarized pre-metal dielectric (PMD) layer 40 is a pair of patterned first conductor layers 42a and 42b. Methods and materials through which patterned conductor layers may be formed within integrated circuit microelectronics fabrications are known in the art of integrated circuit microelectronics fabrication. Patterned conductor layers are typically formed within integrated circuit microelectronics fabrication through patterning, through methods as are conventional in the art, of blanket conductor layers formed within integrated circuit microelectronics fabrications. The blanket conductor layers may be formed of metals, metal alloys, doped polysilicon and polycides. For the second preferred embodiment of the present invention, the patterned first conductor layers 42a and 42b are preferably formed upon the planarized pre-metal dielectric (PMD) layer 40 through patterning, through methods as are conventional in the art, of a blanket first conductor layer formed at least in part of an aluminum containing conductor material, as is common in the art of integrated circuit microelectronics fabrication. Typically and preferably, each of the patterned first conductor layers 42a and 42b so formed is formed with a thickness of from about 4500 to about 8000 angstroms, a linewidth of from about 0.3 to about 3 microns and a separation pitch of from about 0.3 to about 3 microns.

Finally, there is shown in FIG. 7 a series of three blanket dielectric layers formed over the planarized pre-metal dielectric (PMD) layer 40 and the pair of patterned first conductor layers 42a and 42b. The series of three blanket dielectric layers includes: (1) a blanket first inter-metal dielectric (IMD) layer 43 formed upon the planarized pre-metal dielectric (PMD) layer 40 and the pair of patterned first conductor layers 42a and 42b; (2) a blanket first gap filling inter-metal dielectric (IMD) layer 44 formed upon the blanket first conformal inter-metal dielectric (IMD) layer 43; and (5) a blanket first planarized inter-metal dielectric (IMD) layer 45 formed upon the blanket first gap filling inter-metal dielectric (IMD) layer 44. Although each of the foregoing three dielectric layers may be formed through use of methods and materials as are generally known in the art of integrated circuit microelectronics fabrication, the blanket first inter-metal dielectric (IMD) layer 43 is preferably formed through use of methods and materials analogous or equivalent to the methods and materials through which is preferably formed the planarized pre-metal dielectric (PMD) layer 40, with the exception that the blanket first inter-metal dielectric (IMD) layer 43 is not planarized. Preferably, the blanket first inter-metal dielectric (IMD) layer 43 so formed is formed to a thickness of from about 4000 to about 5000 angstroms.

Similarly, while it is also known in the art of integrated circuit microelectronics fabrication that gap filling dielectric layers may be formed through use of methods and materials including but not limited to spin-on-glass (SOG) coating methods and certain higher pressure ozone assisted thermal chemical vapor deposition (CVD) methods through which may be formed gap filling dielectric layers of dielectric materials including but not limited to siloxane spin-on-glass (SOG) dielectric materials, silicate spin-on-glass (SOG) dielectric materials and silicon oxide dielectric materials, for the second preferred embodiment of the present invention, the blanket first gap filling inter-metal dielectric (IMD) layer 44 is preferably formed of at a siloxane spin-on-glass (SOG) dielectric material formed through use of a spin-on-glass (SOG) coating method, as is conventional in the art of integrated circuit microelectronics fabrication. Typically and preferably, the blanket first gap filling inter-metal dielectric (IMD) layer 44 so formed is formed to a thickness of from about 6000 to about 8000 angstroms.

Finally, within the second preferred embodiment of the present invention, the blanket first planarized inter-metal dielectric (IMD) layer 45 is formed of a silicon oxide dielectric material formed through use of a chemical vapor deposition (CVD) method employing tetra-ethyl-ortho-silicate (TEOS) as a silicon source material analogous or equivalent to the chemical vapor deposition (CVD) method employing tetra-ethyl-ortho-silicate (TEOS) as the silicon source material employed in forming at least the exposed portion of the blanket silicon oxide dielectric layer 22 employed within the first preferred embodiment of the present invention as illustrated in FIG. 3. Preferably, the blanket first planarized inter-metal dielectric (IMD) layer 45 so formed is formed to at a thickness of from about 4000 to about 5000 angstroms.

Figure 8:
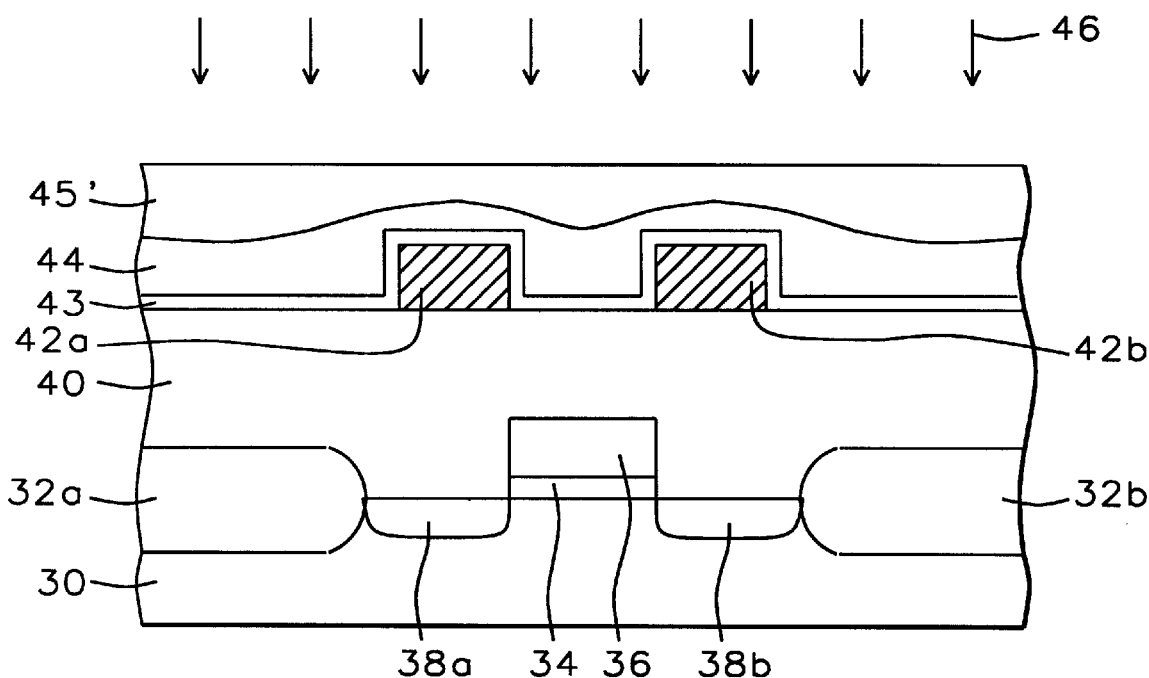

Referring now to FIG. 8, there is shown a schematic cross-sectional diagram of an integrated circuit microelectronics fabrication illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein the blanket first planarized inter-metal dielectric (IMD) layer 45 has been treated with a first plasma 46 to form a blanket plasma treated first planarized inter-metal dielectric (IMD) layer 45'. Within the second preferred embodiment of the present invention, the first plasma 46 is preferably formed employing methods, materials and conditions analogous or equivalent to the methods, materials and conditions employed in forming the first plasma 24 employed within the first preferred embodiment of the present invention as illustrated within the schematic cross-sectional diagram of FIG. 4.

Figure 9:
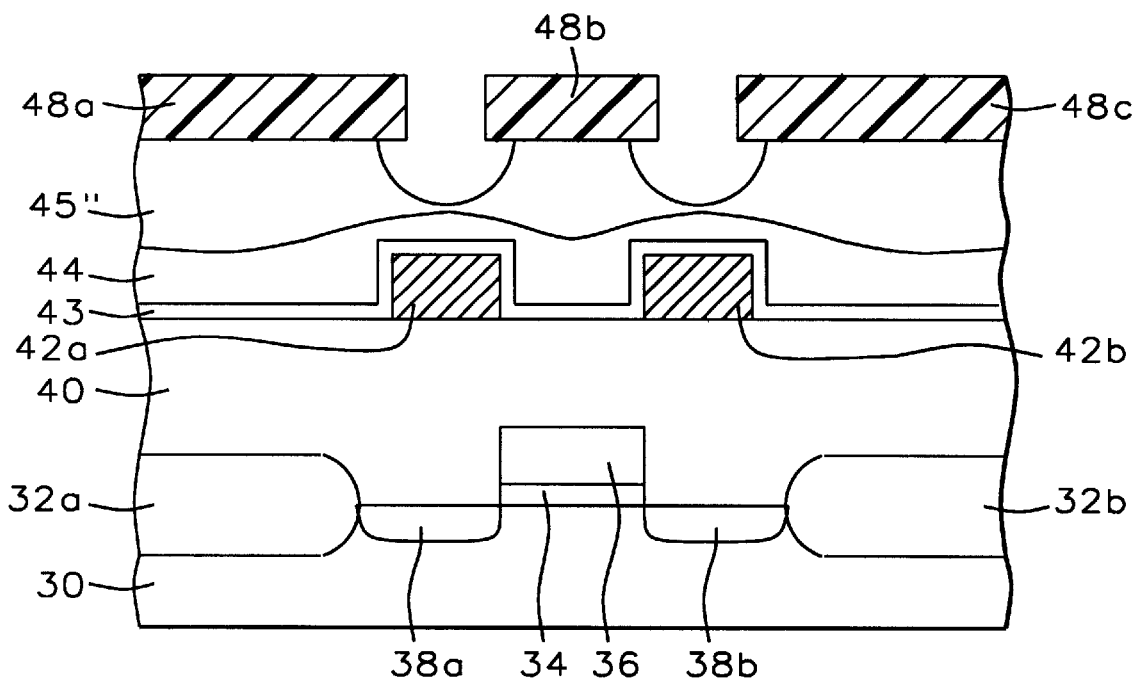

Referring now to FIG. 9, there is shown a schematic cross-sectional diagram of an integrated circuit microelectronics fabrication illustrating the results of further processing of the integrated circuit microelectronics fabrications whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein: (1) there has been formed upon the blanket plasma treated first planarized inter-metal dielectric (IMD) layer 45' a series of patterned first photoresist layers 48a, 48b and 48c; and (2) there is then isotropically etched the blanket plasma treated first planarized inter-metal dielectric (IMD) layer 45' to form the partially isotropically etched blanket plasma treated first planarized inter-metal dielectric (IMD) layer 45" having a pair of bowl shaped apertures formed therein.

Within the second preferred embodiment of the present invention, the series of patterned first photoresist layers 48a, 48b and 48c is preferably formed employing methods, materials and dimensions analogous or equivalent to the methods, materials and dimensions employed in forming the series of patterned photoresist layers 26a, 26b and 26c employed within the first preferred embodiment of the present invention as illustrated in FIG. 5. Similarly, within the second preferred embodiment of the present invention, the partially isotropically etched blanket plasma treated first planarized inter-metal dielectric (IMD) layer 45" as illustrated in FIG. 9 is preferably formed from the blanket plasma treated first planarized inter-metal dielectric (IMD) layer 45' as illustrated in FIG. 8 through methods and materials analogous or equivalent to the methods and materials through which the partially isotropically etched blanket plasma treated silicon oxide dielectric layer 22" employed within the first preferred embodiment of the present invention as illustrated in FIG. 5 is formed from the blanket plasma treated silicon oxide dielectric layer 22' as illustrated in FIG. 4.

As is illustrated in FIG. 9, it is preferable within the first preferred embodiment of the present invention when partially isotropically etching the blanket plasma treated first planarized inter-metal dielectric (IMD) layer 45' when forming the partially isotropically etched blanket plasma treated first planarized inter-metal dielectric (IMD) layer 45" not to reach the blanket first gap filling inter-metal dielectric (IMD) layer 44. When reaching the blanket first gap filling inter-metal dielectric (IMD) layer 44 the bowl shaped contours of the bowl shaped apertures within the partially isotropically etched blanket plasma treated first planarized inter-metal dielectric (IMD) layer 45" may be compromised.

Figure 10:
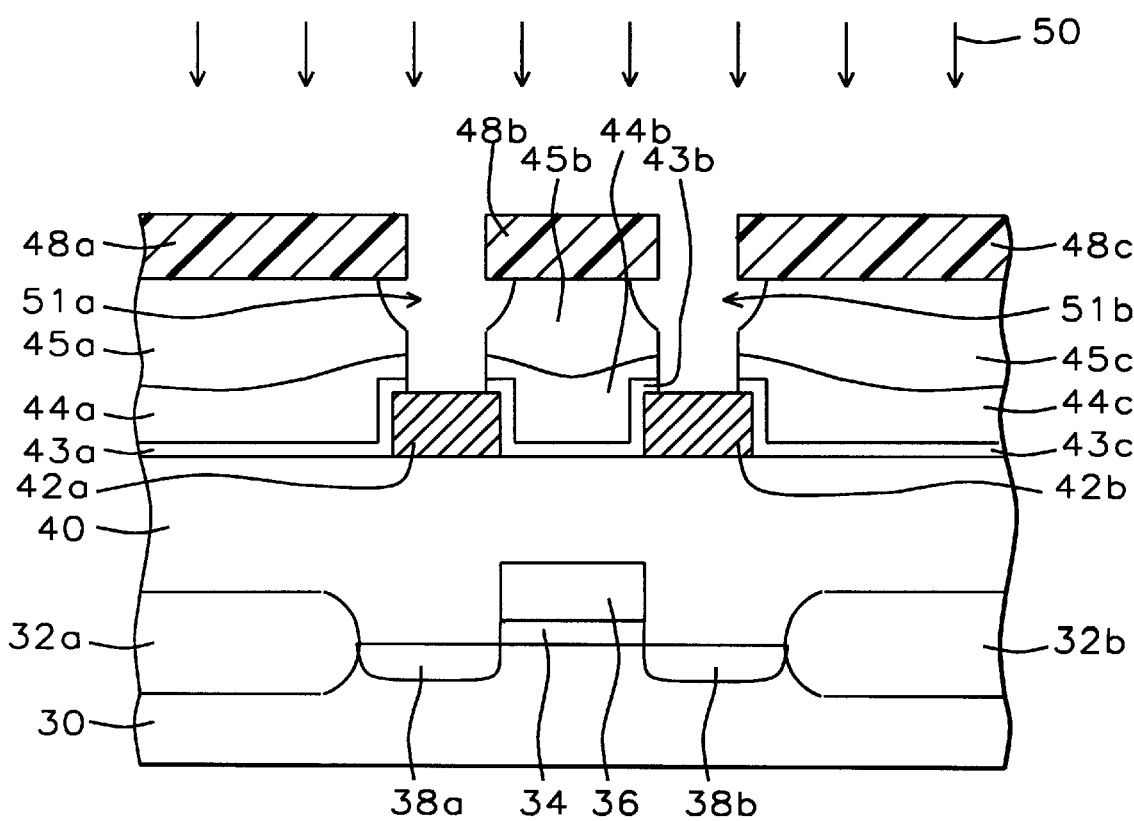

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein the bowl shaped apertures within the partially isotropically etched blanket plasma treated first planarized inter-metal dielectric layer 45" have been completely etched employing a second plasma 50 to form a pair of wine glass shaped interconnection vias 51a and 51b accessing the patterned first conductor layers 42a and 42b, while simultaneously: (1) forming from the partially isotropically etched blanket plasma treated first planarized inter-metal dielectric (IMD) layer 45" a series of patterned plasma treated first planarized inter-metal dielectric (IMD) layers 45a, 45b, and 45c; (2) forming from the blanket gap filling inter-metal dielectric (IMD) layer 44 a series of patterned first gap filling inter-metal dielectric (IMD) layers 44a, 44b and 44c; and (3) forming from the blanket first inter-metal dielectric (IMD) layer 43 a series of patterned first inter-metal dielectric (IMD) layers 45a, 43b and 43c. Within the second preferred embodiment of the present invention, the second plasma 50 is preferably formed employing methods, materials and conditions analogous or equivalent to the methods, materials and conditions employed in forming the second plasma 28 employed within the first preferred embodiment of the present invention as illustrated in FIG. 6.

Similarly with the first preferred embodiment of the present invention, the pair of wine glass shaped interconnection vias 51a and 51b as illustrated in FIG. 10 is formed without over-etching the pair of wine glass shaped vias 51a and 51b, since the pair of wine glass shaped vias 51a and 51b is formed without partial delamination of the patterned first photoresist layers 48a, 48b and 48c from the corresponding patterned plasma treated first planarized inter-metal dielectric (IMD) layers 45a, 45b and 45c.

Figure 11:
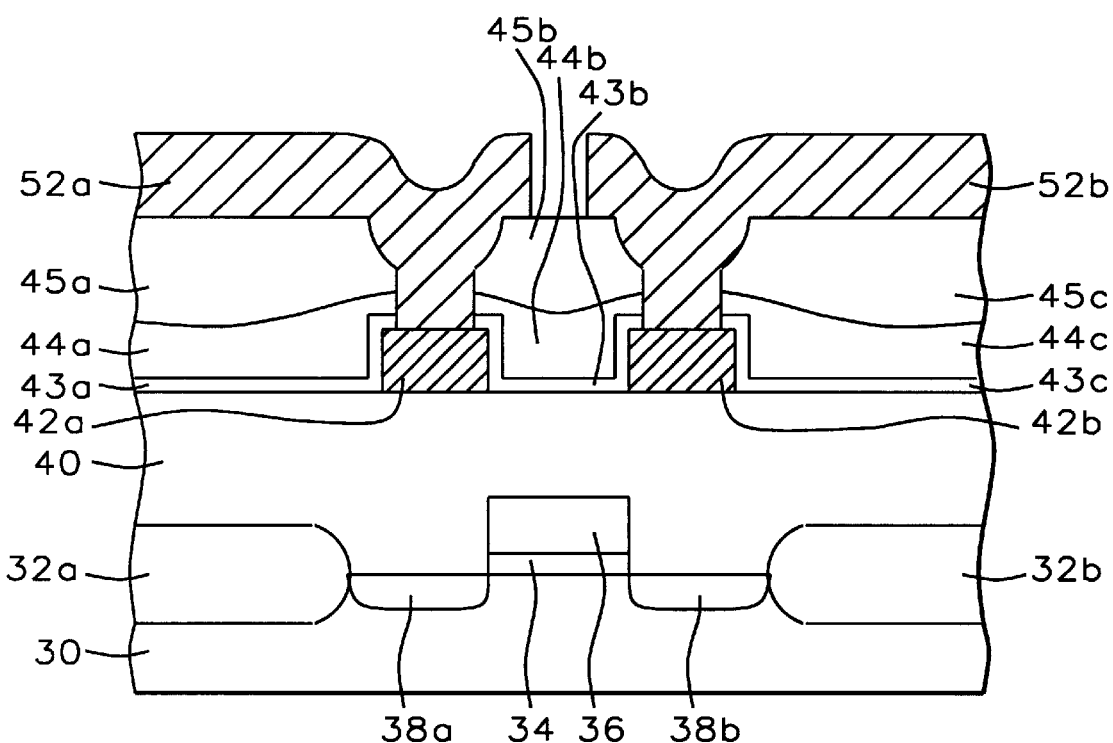

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein: (1) the patterned first photoresist layers 48a, 48b and 48c have been stripped from the integrated circuit microelectronics fabrication; and (2) there is then formed a pair of patterned second conductor layers 52a and 52b contacting the corresponding patterned first conductor layers 42a and 42b while filling the corresponding wine glass shaped vias. Within the second preferred embodiment of the present invention, the patterned first photoresist layers 48a, 48b and 48c are stripped from the integrated circuit microelectronics fabrication whose schematic cross-sectional diagram is illustrated in FIG. 10 to provide in part the integrated circuit microelectronics fabrication whose schematic cross-sectional diagram is illustrated in FIG. 11 through methods as are conventional in the art, which will typically, although not exclusively, include wet chemical stripping methods and dry oxygen plasma stripping methods. Similarly, within the second preferred embodiment of the present invention, the patterned second conductor layers 52a and 52b are preferably formed employing methods, materials and dimensions analogous or equivalent to the methods, materials and dimensions employed in forming the patterned first conductor layers 42a and 42b.

As is seen within the schematic cross-sectional diagram of FIG. 11, the patterned second conductor layers 52a and 52b are formed functionally and reliably without shorting or forming residues therebetween since the wine glass shaped vias within which are formed the patterned second conductor layers 52a and 52b are formed without over-etching due to partial delamination of the patterned first photoresist layers 48a, 48b and 48c from the corresponding patterned plasma treated first planarized inter-metal dielectric (IMD) layers 45a, 45b and 45c.

EXAMPLES

Upon each semiconductor substrate within a series of four semiconductor substrates was formed at a silicon oxide dielectric layer of thickness about 4500 angstroms through use of a plasma enhanced chemical vapor deposition (CVD) method employing tetra-ethyl-ortho-silicate (TEOS) as at a silicon source material. The plasma enhanced chemical vapor deposition (PECVD) method employed: (1) a reactor chamber pressure of about 9 torr; (2) a radio frequency power of about 700 watts at a radio frequency of 13.56 MHZ; (3) a semiconductor substrate temperature of about 400 degrees centigrade; (4) a tetra-ethyl-ortho-silicate (TEOS) concentration of about 800 milligrams per cubic meter (mgm); and (5) an oxygen oxidant flow rate of about 500 standard cubic centimeters per minute (sccm).

The silicon oxide dielectric layers upon three of the four semiconductor substrates were then exposed to either an oxygen plasma treatment or a nitrogen plasma treatment employing: (1) a reactor chamber pressure of about 9 torr; (2) a radio frequency power of about 700 watts at a radio frequency of 13.56 MHZ, to form from the silicon oxide dielectric layers plasma treated silicon oxide dielectric layers. The oxygen plasma treatment or the nitrogen plasma treatment was provided for a varying exposure time and a varying oxygen or nitrogen flow rate.

Upon each of the three plasma treated silicon oxide dielectric layers and the one untreated silicon oxide dielectric layer was then formed a patterned photoresist layer of a PFI58 positive photoresist material available from Sumitomo Chemical Company. The patterned photoresist layers were each formed to at a thickness of about 8700 angstroms with circular apertures of diameter about 0.55 microns formed therethrough. Each circular aperture was separated from a nearest adjoining circular aperture by at a distance of about 0.4 microns.

The portions of the plasma treated silicon oxide dielectric layers or the unexposed silicon oxide dielectric layer exposed within the circular apertures through the patterned photoresist layers were then partially isotropically etched employing a 20:1 buffered oxide etchant (BOE) (ie: 20 parts 20% aqueous ammonium fluoride: 1 part 49% aqueous hydrofluoric acid; vol:vol) at a temperature of about 23 degrees centigrade for a time period of about 225 seconds to etch within each of the silicon oxide dielectric layers a series of bowl shaped apertures to at a depth of about 3000 angstroms each.

While still employing the patterned photoresist layers as photoresist etch mask layers, the remaining thicknesses of the plasma treated silicon oxide dielectric layers or the untreated silicon oxide dielectric layer were etched employing an anisotropic reactive ion etch (RIE) plasma etch method employing a carbon tetrafluoride, trifluoromethane and argon etchant gas composition to form therefrom patterned plasma treated silicon oxide dielectric layers or a patterned untreated silicon oxide dielectric layer, either of which had defined therein a series of wine glass shaped vias corresponding with the series of circular apertures within the patterned photoresist layers. The reactive ion etch (RIE) plasma etch method also employed. (1) a reactor chamber pressure of about 300 mtorr; (2) a radio frequency power of about 1300 watts at a radio frequency of 13.56 MHZ; (3) a semiconductor substrate temperature of about zero degrees centigrade; (4) a gap of from about 7.5 to about 12 mils; (5) a carbon tetrafluoride flow rate of about 60 standard cubic centimeters per minute (sccm); and (6) a background argon flow rate of about 400 standard cubic centimeters per minute (sccm).

The patterned photoresist layers were then stripped from each of the patterned plasma treated silicon oxide dielectric layers or the patterned untreated silicon oxide dielectric layer employing an oxygen plasma stripping method conventional in the art of integrated circuit microelectronics fabrication. There was then formed into the wine glass shaped vias defined by the patterned plasma treated silicon oxide dielectric layers or the patterned untreated silicon oxide dielectric layer a series of patterned aluminum containing conductor layers intended to fill each wine glass shaped via individually.

Finally, there was then determined through use of a cross-sectional scanning electron microscope (SEM) inspection method a series of lateral:vertical etch rate ratios for the cup shaped portion of sample wine glass shaped vias formed through the plasma treated silicon oxide dielectric layers or the untreated silicon oxide dielectric layer. The results of the scanning electron microscope (SEM) inspection as a function of plasma treatment of the silicon oxide layer are reported within Table I.

TABLE I

| Example | Plasma Treatment | Lateral:Vertical Etch Ratio |
|---|---|---|
| 1 | O2 - 500 sccm/5 seconds | 1.35 |
| 2 | O2 - 500 sccm/25 seconds | 1.00 |
| 3 | N2 - 1000 sccm/5 seconds | 1.65 |
| 4 | none | 3.35 |

As is seen from review of the data in Table I, the oxygen or nitrogen plasma treatment of the silicon oxide dielectric layers in accord with the preferred embodiments of the present invention provides blanket plasma treated silicon oxide dielectric layers through which there may be formed wine glass shaped vias with less susceptibility to overetching. Consequently patterned conductor layers when formed within those wine glass shaped vias are less susceptible to shorting.

As is understood by at a person skilled in the art, the preferred embodiments and examples of the present invention are illustrative of the present invention rather than limiting of the present invention. Revisions and modifications may be made to methods, materials, structures and dimensions through which are provided the preferred embodiments and examples of the present invention while still providing embodiments and examples which are within the spirit and scope of the present invention, as defined by the accompanying claims.

What is claimed is:

1. A microelectronics fabrication having a silicon oxide dielectric layer formed according to the steps comprising:

providing a substrate employed within a microelectronics fabrication;

forming over the substrate a silicon oxide dielectric layer, the silicon oxide dielectric layer being formed through use of a chemical vapor deposition (CVD) method employing tetra-ethyl-ortho-silicate (TEOS) as a silicon source material;

treating the silicon oxide dielectric layer with an oxygen plasma to form from the silicon oxide dielectric layer an oxygen plasma treated silicon oxide dielectric layer; and forming upon the oxygen plasma treated silicon oxide dielectric layer a patterned photoresist layer, where the oxygen plasma treatment of the silicon oxide dielectric layer enhances adhesion of the patterned photoresist layer to the oxygen plasma treated silicon oxide dielectric layer.

2. A microelectronics fabrication having a silicon oxide dielectric layer formed according to the steps comprising:

providing a substrate employed within a microelectronics fabrication;

forming over the substrate a silicon oxide dielectric layer, the silicon oxide dielectric layer being formed through use of a chemical vapor deposition (CVD) method employing tetra-ethyl-ortho-silicate (TEOS) as a silicon source material;

treating the silicon oxide dielectric layer with an oxygen plasma to form an oxygen plasma treated silicon oxide dielectric layer; wherein the oxygen plasma treatment of the silicon oxide dielectric layer is conducted within a reactor chamber at a pressure of from about 7 to 11 torr, a radio frequency power of from about 600 to 800 watts at a radio frequency of about 13.56 MHz, a substrate temperature of from about 350 to 450° C., an oxygen flow of from about 400 to 600 sccm, and for a time from about 3 to 10 seconds;

forming upon the oxygen plasma treated silicon oxide dielectric layer a patterned photoresist layer employed in defining the location of a via to be formed through the oxygen plasma treated silicon oxide dielectric layer, where the oxygen plasma treatment of the silicon oxide dielectric layer enhances adhesion of the patterned photoresist layer to the oxygen plasma treated silicon oxide dielectric layer; and etching the via through the oxygen plasma treated silicon oxide dielectric layer while employing an isotropic etch method.

3. A microelectronics fabrication having a silicon oxide dielectric layer formed according to the steps comprising:

providing a semiconductor substrate;

forming over the semiconductor substrate an SOG layer;

forming over the SOG layer, a silicon oxide dielectric layer, the silicon oxide dielectric layer being formed through use of a chemical vapor deposition (CVD) method employing tetra-ethyl-ortho-silicate (TEOS) as a silicon source material;

treating the silicon oxide dielectric layer with an oxygen plasma to form an oxygen plasma treated silicon oxide dielectric layer; wherein the oxygen plasma treatment of the silicon oxide dielectric layer is conducted within a reactor chamber at a pressure of from about 7 to 11 torr, a radio frequency power of from about 600 to 800 watts at a radio frequency of about 13.56 MHz, a substrate temperature of from about 350 to 450° C., an oxygen flow of from about 400 to 600 sccm, and for a time from about 3 to 10 seconds;

forming upon the oxygen plasma treated silicon oxide dielectric layer a patterned photoresist layer employed in defining the location of a wine glass shaped via to be formed through the oxygen plasma treated silicon oxide dielectric layer and the SOG layer, where the oxygen plasma treatment of the silicon oxide dielectric layer enhances adhesion of the patterned photoresist layer to the oxygen plasma treated silicon oxide dielectric layer;

isotropically etching the oxygen plasma treated silicon oxide dielectric layer to form a bowl shaped aperture; and anisotropically etching said remaining oxygen plasma treated silicon oxide dielectric layer and said SOG layer using the patterned photoresist layer as an etch mask to form the wine glass shaped via.

4. The method of claim 1 wherein the oxygen plasma treatment of the silicon oxide dielectric layer is conducted within a reactor chamber at a pressure of from about 7 to 11 torr, a radio frequency power of from about 600 to 800 watts at a radio frequency of about 13.56 MHz, a substrate temperature of from about 350 to 450° C., a susceptor spacing of from about 180 to 280 mils, an oxygen flow of from about 400 to 600 sccm, and for a time from about 3 to 10 seconds.

5. The method of claim 2 wherein the oxygen plasma treatment of the silicon oxide dielectric layer is further conducted at a susceptor spacing of from about 180 to 280 mils.

6. The method of claim 3 wherein the oxygen plasma treatment of the silicon oxide dielectric layer is further conducted at a susceptor spacing of from about 180 to 280 mils.

7. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

8. The method of claim 1 wherein:
   the chemical vapor deposition (CVD) method is chosen from the group of chemical vapor deposition methods consisting of thermal chemical vapor deposition (CVD) methods and plasma enhanced chemical vapor deposition (PECVD) methods; and
   the silicon oxide dielectric layer is chosen from the group of silicon oxide dielectric layers consisting of undoped silicon oxide dielectric layers and doped silicon oxide dielectric layers.

9. The method of claim 1 wherein the adhesion of the patterned photoresist layer to the plasma treated silicon oxide dielectric layer is enhanced when the plasma treated silicon oxide dielectric layer is exposed to an isotropic etch method selected from the group of isotropic etch methods consisting of wet chemical etch methods and high pressure reactive ion etch (RIE) etch methods.

10. The method of claim 2 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

11. The method of claim 2 wherein:
   the chemical vapor deposition (CVD) method is chosen from the group of chemical vapor deposition methods consisting of thermal chemical vapor deposition (CVD) methods and plasma enhanced chemical vapor deposition (PECVD) methods; and
   the silicon oxide dielectric layer is chosen from the group of silicon oxide dielectric layers consisting of undoped silicon oxide dielectric layers and doped silicon oxide dielectric layers.

12. The method of claim 2 wherein the isotropic etch method is selected from the group of isotropic etch methods consisting of wet chemical etch methods and high pressure reactive ion etch (RIE) etch methods.

13. The method of claim 3 wherein:
   the chemical vapor deposition (CVD) method is chosen from the group of chemical vapor deposition methods consisting of thermal chemical vapor deposition (CVD) methods and plasma enhanced chemical vapor deposition (PECVD) methods; and
   the silicon oxide dielectric layer is chosen from the group of silicon oxide dielectric layers consisting of undoped silicon oxide dielectric layers and doped silicon oxide dielectric layers.

14. The method of claim 3 wherein the isotropic etch method is selected from the group of isotropic etch methods consisting of wet chemical etch methods and high pressure reactive ion etch (RIE) etch methods.

* * * * *